United States Patent
Totani et al.

(10) Patent No.: US 9,698,310 B2
(45) Date of Patent: Jul. 4, 2017

(54) METHOD FOR PRODUCING A SEMICONDUCTOR DEVICE

(71) Applicant: TOYODA GOSEI CO., LTD., Kiyosu-shi (JP)

(72) Inventors: Shingo Totani, Kiyosu (JP); Jun Nakauchi, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 14/991,762

(22) Filed: Jan. 8, 2016

(65) Prior Publication Data

US 2016/0211418 A1 Jul. 21, 2016

(30) Foreign Application Priority Data

Jan. 15, 2015 (JP) .................................. 2015-005586

(51) Int. Cl.
*H01L 33/42* (2010.01)
*H01L 33/32* (2010.01)

(52) U.S. Cl.
CPC ............... *H01L 33/42* (2013.01); *H01L 33/32* (2013.01); *H01L 2933/0016* (2013.01)

(58) Field of Classification Search
CPC ............ H01L 51/5016; H01L 51/0085; H01L 51/0072; H01L 51/0087; H01L 51/0081; H01L 51/5206; H01L 27/1225; H01L 51/0048; H01L 51/5234; H01L 2924/0002
See application file for complete search history.

(56) References Cited

FOREIGN PATENT DOCUMENTS

JP 2014-154584 A 8/2014

OTHER PUBLICATIONS

JP 2014-154584 [machine's translation] [Aug. 2014].*

* cited by examiner

*Primary Examiner* — Tony Tran
(74) *Attorney, Agent, or Firm* — McGinn IP Law Group, PLLC

(57) ABSTRACT

The present invention provides a method for producing a semiconductor device exhibiting the improved emission efficiency by reducing a strain between a p-contact layer and a transparent electrode. A transparent electrode made of IZO (Zinc-doped Indium Oxide) was formed on a p-type contact layer by vapor deposition or sputtering. Subsequently, a p-type cladding layer and a p-type contact layer were p-type activated and a transparent electrode was crystallized by indirect resistance heating. This heat treatment was performed under a reduced pressure at a temperature of 700° C. Next, microwave heating was performed for three to thirty minutes at a temperature of 100° C. to 350° C. by microwave irradiation with a frequency of 5.8 GHz in a nitrogen atmosphere. This reduced a strain of the transparent electrode, and improved the conductivity or translucency of the transparent electrode.

4 Claims, 4 Drawing Sheets

METHOD FOR PRODUCING A SEMICONDUCTOR DEVICE

BACKGROUND OF THE INVENTION

Field of the Invention

The present invention relates to a method for producing a Group III nitride semiconductor device, and more specifically, to a method for reducing a strain between a Group III nitride semiconductor and a transparent electrode.

Background Art

In the conventional method for producing a Group III nitride semiconductor light-emitting device, after the formation of the transparent electrode made of a material such as ITO and IZO on a p-type layer, heat treatment is performed to crystallize the transparent electrode. This improves the conductivity of the transparent electrode and reduces the light absorptivity.

Japanese Patent Application Laid-Open (kokai) No. 2014-154584 describes that the p-type layer and the transparent electrode are preferentially heated by microwave heating so as to activate the p-type layer and crystallize the transparent electrode at the same time.

However, as crystallization of the transparent electrode progresses by heat treatment, a strain is caused by different crystal structure or lattice mismatch between the p-type layer and the transparent electrode. Since the strain absorbs light, the emission efficiency was reduced.

A temperature suitable for crystallization of the transparent electrode is higher than the heat treatment temperature for p-type activation. However, heat treatment for p-type activation and crystallization of the transparent electrode are usually performed at the same time, considering thermal damage to the light-emitting layer or simplification of process. As a result, the transparent electrode is not sufficiently crystallized, and there was a room for improvement in conductivity or translucency.

SUMMARY OF THE INVENTION

An object of the present invention is to reduce a strain between the Group III nitride semiconductor layer and the transparent electrode. It is also to further improve conductivity or translucency of the transparent electrode.

In an aspect of the present invention, there is provided a method for producing a semiconductor device having a transparent electrode on and in contact with a Group III nitride semiconductor layer, the method comprising a first step of performing heat treatment by at least one of indirect resistance heating and infrared heating under an atmosphere containing nitrogen in a normal atmospheric pressure or a reduced pressure after the formation of the transparent electrode to crystallize the transparent electrode, and a second step of reducing a strain between the semiconductor layer and the transparent electrode by microwave heating under an atmosphere containing nitrogen.

The transparent electrode may be formed of ITO (Indium Tin Oxide), IZO (Zinc-doped Indium Oxide), ICO (Cerium-doped Indium Oxide), and others. The present invention is effective particularly when IZO is used. IZO could not be sufficiently crystallized when p-activation and crystallization of the transparent electrode are performed at the same time because a temperature suitable for crystallization of IZO is high. However, the present invention allows sufficient crystallization of IZO.

In the second heating step, the frequency of the microwave is, for example, 0.9 GHz to 24.6 GHz. The heating time is preferably three to thirty minutes. The temperature is, preferably, 100° C. to 350° C. However, it is noted that this temperature is not the actual temperature of the transparent electrode but the temperature of the wafer. Moreover, an atmosphere gas containing nitrogen may be a nitrogen gas itself or a mixture gas of inert gas such as argon, neon, and krypton or other inactive gas mixed with nitrogen.

In the first step, the temperature of indirect resistance heating or infrared heating, is preferably 600° C. to 800° C. An atmosphere gas containing nitrogen may be a nitrogen gas itself or a mixture gas of an inert gas such as argon, neon, and krypton, or other inactive gas mixed with nitrogen. The heating time is preferably one to twenty minutes. When heat treatment is performed under a reduced pressure, the pressure is preferably 100 Pa.

After the second step, a third step may be provided to perform another heat treatment by at least one of indirect resistance heating and infrared heating under an atmosphere containing oxygen to further crystallize the transparent electrode. This can reduce a strain between the semiconductor layer and the transparent electrode.

In the third step, the temperature of indirect resistance heating or infrared heating is preferably 400° C. to 650° C. Moreover, an atmosphere gas containing oxygen may be an oxygen gas itself or a mixture gas of an inert gas such as argon, neon, and krypton, or other inactive gas mixed with oxygen. The heating time is preferably one to twenty minutes.

The present invention can be applied to a method for producing various semiconductor devices such as light-emitting device, pn diode, photo diode, FET, and HFET. Particularly, it is preferably applied to the method for producing a light-emitting device.

According to the present invention, a strain between the transparent electrode and the semiconductor layer can be reduced. Particularly in the light-emitting device, light absorption due to a strain can be reduced. Moreover, translucency and conductivity can be improved by further promoting the crystallization of the transparent electrode, thereby improving the emission efficiency.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

A specific embodiment of the present invention will next be described with reference to the drawings. However, the present invention is not limited to the embodiments.

Embodiment 1

Figure 1A:
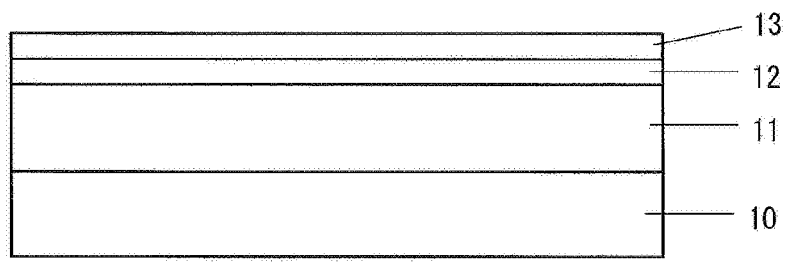
FIGS. 1A to 1D are sketches showing processes for forming a light-emitting device according to Embodiment 1.

FIGS. 1A to 1D are sketches showing processes for forming a light-emitting device according to Embodiment 1. FIG. 2 is a flowchart showing a part (before and after the formation of transparent electrode 15) of the processes for producing a light-emitting device according to Embodiment 1. Next will be described the processes for producing the Group III nitride semiconductor light-emitting device according to Embodiment 1 with reference to FIGS. 1A to 1D, and FIG. 2.

Firstly, a sapphire substrate 10 was prepared, and thermally treated in a hydrogen atmosphere so as to remove impurities adhering to the surface. Next, an AlN buffer layer (not illustrated) was formed on the sapphire substrate 10. An n-type layer 11, a light-emitting layer 12, and a p-type cladding layer 13 were sequentially deposited through MOCVD on the buffer layer (FIG. 1A).

Each of the n-type layer 11, the light-emitting layer 12, and the p-type cladding layer 13 may have various known structures.

For example, the n-type layer 11 may have a layer structure of an n-type contact layer, an ESD layer, and an n-type cladding layer sequentially deposited on the sapphire substrate 10. The n-type contact layer is formed of, for example, GaN doped with Si at a high concentration. The ESD layer comprises, for example, a first ESD layer and a second ESD layer on the n-type contact layer. The first ESD layer has a thickness of 50 nm to 500 nm. The first ESD layer is an undoped GaN layer having a pit of $2\times10^8/cm^2$ or more thereon. The second ESD layer has a thickness of 25 nm to 50 nm. The second ESD layer is a Si-doped GaN having a characteristic value, as defined by the product of Si concentration ($/cm^3$) and thickness (nm), of $0.9\times10^{20}$ to $3.6\times10^{20}$ ($nm/cm^3$). The n-type cladding layer has a superlattice structure in which a plurality of layer units are repeatedly deposited, each layer unit comprising, for example, undoped InGaN, undoped GaN, and Si-doped GaN sequentially deposited.

The light-emitting layer 12 may have a MQW structure in which a GaN barrier layer and an InGaN well layer are repeatedly deposited.

The p-type cladding layer 13 may have a superlattice structure in which for example, Mg-doped InGaN and Mg-doped AlGaN are repeatedly deposited.

The growth temperature of the n-type layer 11 is 1,000° C. to 1,100° C. for the n-contact layer, 800° C. to 950° C. for the ESD layer, and 800° C. to 900° C. for the n-type cladding layer. Moreover, the growth temperature of the light-emitting layer 12 is 800° C. to 950° C. for the barrier layer, and 700° C. to 800° C. for the well layer. The growth temperature of the p-type cladding layer 13 is 800° C. to 900° C.

The raw material gases employed for MOCVD are as follows: ammonia ($NH_3$) as a nitrogen source, trimethylgallium ($Ga(CH_3)_3$) as a Ga source, trimethylindium ($In(CH_3)_3$) as an indium source, trimethylaluminum ($Al(CH_3)_3$) as an aluminum source, silane ($SiH_4$) as an n-type dopant gas, and biscyclopentadienylmagnesium ($Mg(C_5H_5)_2$) as a p-type dopant gas, and $H_2$ or $N_2$ as a carrier gas. The surface of the sapphire substrate 10 may be roughened to improve the crystallinity, prevent cracks, and improve the light extraction efficiency. The substrate 10 is made of sapphire. Other than sapphire, materials such as SiC, Si, ZnO, and spinel may be employed.

Figure 1B:
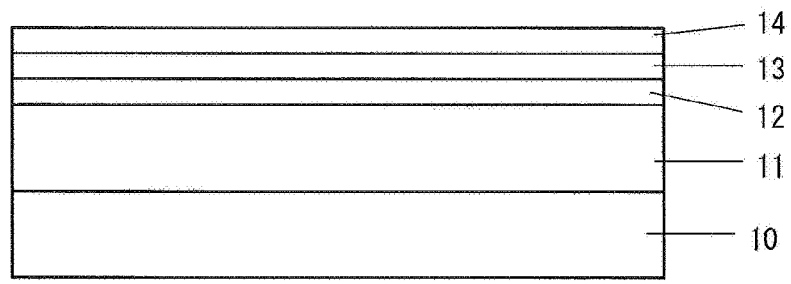
Figure 2:
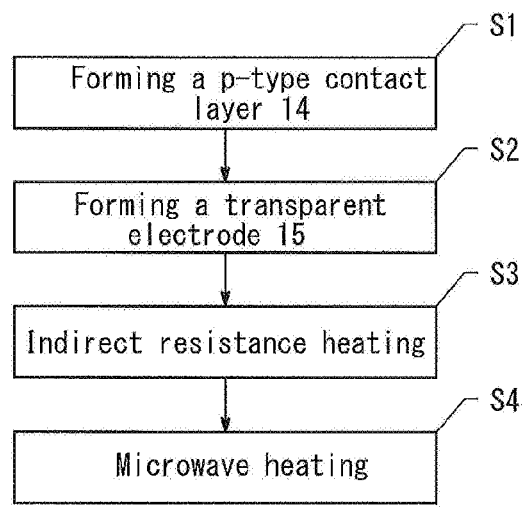
FIG. 2 is a flowchart showing a part of the processes for producing a light-emitting device according to Embodiment 1.

Subsequently, a p-type contact layer 14 was formed through MOCVD on the p-type cladding layer 13 (FIG. 1B, step S1 of FIG. 2). The p-type contact layer 14 may have any known structure, for example, a single layer made of Mg-doped GaN. The p-type contact layer 14 also may comprise a plurality of layers of GaN having different Mg concentrations. A layer more distant from the p-type cladding layer 13 may have a higher Mg concentration. When the p-type contact layer 14 comprises a plurality of layers, the top layer may be formed of Mg-doped InGaN to lower the contact resistance. The Mg concentration of the p-type contact layer 14 may be within a conventional range, for example, $1\times10^{19}/cm^3$ to $1\times10^{21}/cm^3$.

The growth rate of the p-type contact layer 14 is preferably not more than 10 nm/min to suppress pits generation. The growth temperature of the p-type contact layer 14 is preferably 900° C. to 1,100° C. to reduce damage on the light-emitting layer 12 and improve the crystallinity.

Figure 1C:
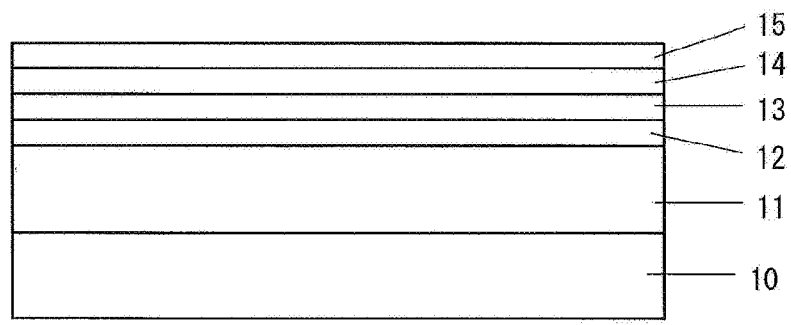

Then, a transparent electrode 15 made of IZO (Zn-doped indium oxide) was formed on the p-type contact layer 14 by vapor deposition or sputtering (FIG. 1C, step S2 of FIG. 2). The transparent electrode 15 may be formed of ITO and ICO (cerium-doped indium oxide) other than IZO. Particularly, IZO is preferably used as in Embodiment 1. A temperature suitable for crystallization of IZO is higher than that of ITO, and 450° C. to 800° C. When microwave heating is performed so that the temperature of IZO is within such a range, the light-emitting layer 12 is heated to a temperature higher than the temperature range, and damaged. Moreover, when microwave heating is performed at an output power so as not to cause damage on the light-emitting layer 12, IZO is not sufficiently crystallized. However, according to the method of Embodiment 1 described below, IZO can be further crystallized without causing thermal damage on the light-emitting layer 12, thereby improving translucency and conductivity.

Next, the p-type cladding layer 13, the p-type contact layer 14, and the transparent electrode 15 were heated by indirect resistance heating, and the p-type activation of the p-type cladding layer 13 and the p-type contact layer 14, and the crystallization of the transparent electrode 15 were conducted (step S3). This heat treatment was performed under a reduced pressure at a temperature of 700° C. for 5 minutes. Heat treatment is performed at the same time for the p-type activation of the p-type cladding layer 13 and the p-type contact layer 14 and for the crystallization of the transparent electrode 15, considering the reduction of thermal damage on the light-emitting layer 12 or the simplification of the process. This heat treatment changes the transparent electrode 15 from amorphous to polycrystalline crystallinity.

The heat treatment conditions are not limited to the above. Heat treatment may be performed as long as the pressure is in a range of not more than normal atmospheric pressure (1 atm, or $10^5$ Pa) and the heating temperature is in a range of 600° C. to 800° C. Atmosphere may be a gas atmosphere containing nitrogen or a mixture gas of inert gas such as argon and neon or other inactive gas mixed with nitrogen. The heating time may be one to twenty minutes. Under these conditions, the crystallization of the transparent electrode 15 can be performed as well as the p-type activation of the p-type cladding layer 13 and the p-type contact layer 14 can be sufficiently attained. In case of heat treatment under a reduced pressure, the pressure is preferably 100 Pa or less. Moreover, infrared heating may be employed instead of indirect resistance heating. Infrared heating is, for example, lamp heating.

As the crystallization of the transparent electrode 15 progresses by this heat treatment, a strain occurs in the transparent electrode 15, which is considered to be caused by different crystal structure or lattice mismatch between the p-type contact layer 14 and the transparent electrode 15. Since the strain absorbs light, the emission efficiency is reduced.

Therefore, microwave heating was performed under the following conditions to reduce such a strain (step S4). A wafer was placed on a Si wafer, and introduced in a microwave heating apparatus. In a nitrogen atmosphere, the wafer was irradiated with a microwave having frequency of 5.8 GHz, and heated for three to thirty minutes to a temperature of 100° C. to 350° C. The heating temperature in this microwave heating is the temperature value of the Si wafer measured by a pyrometer. The temperature of the transparent electrode 15 should directly be measured, however, that temperature measurement is difficult. Therefore, the Si wafer temperature is substituted.

An atmosphere in microwave heating is not limited to the above nitrogen atmosphere. As long as the atmosphere is a gas atmosphere containing nitrogen, a mixture gas of an inert gas such as argon and neon or other inactive gas mixed with nitrogen may be employed. The microwave frequency is not limited to 5.8 GHz. It may be within a range of 0.9 GHz to 24.6 GHz, and more preferably, 2.40 GHz to 5.88 GHz. The heating time is, more preferably, five to twenty minutes. The heating temperature is, more preferably, 100° C. to 200° C.

This microwave heating reduced a strain of the transparent electrode 15, and improved the conductivity or translucency of the transparent electrode 15. Since the output power of the microwave heating is weak, there is little thermal damage on the light-emitting layer 12. This hardly affects the reduction of the emission efficiency. In this way, a strain is reduced and light absorption is reduced, and the conductivity or the translucency is improved due to the improvement of the crystallinity of the transparent electrode 15, thereby improving the emission efficiency.

The reason that a strain is reduced is assumed as follows. The transparent electrode 15 is made polycrystalline by heat treatment in the previous process, and has a structure comprising a plurality of crystal grains. In microwave heating, a grain boundary (a boundary between crystal grains) is preferentially heated although the reason is unknown. Therefore, atoms of the transparent electrode 15 on the p-type contact layer 14 side are rearranged so as to reduce a strain.

Heat treatment for the crystallization of the transparent electrode 15 before reducing a strain seems to be performed by microwave heating. However, it has the following problems. The conditions for microwave heating are different before and after the crystallization of the transparent electrode 15. This is because carriers are generated accompanying with crystallization of the transparent electrode 15, and the microwave acts on the carriers to elevate the temperature at a crystalized region. Therefore, when the transparent electrode 15 is partially crystallized, the crystallized portion and the uncrystallized portion are differently heated, causing a thermal gradient. As a result, the transparent electrode 15 is not uniformly crystallized. Therefore, as in Embodiment 1, heat treatment need to be performed in two steps of indirect resistance heating for the crystallization of the transparent electrode 15 and microwave heating for the reduction of the strain thereafter.

Figure 1D:
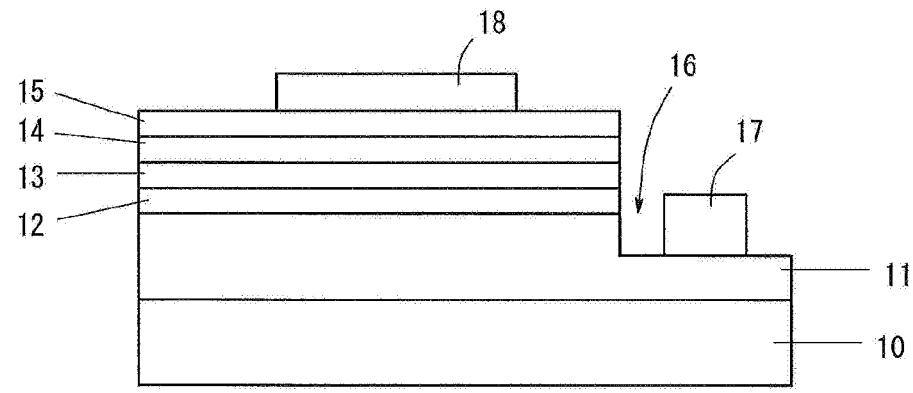

Next, after the transparent electrode 15 was patterned by wet etching, a trench 16 was formed so as to have a depth reaching the n-type layer 11 by dry etching a predetermined region from the transparent electrode 15. An n-electrode 17 was formed on the bottom surface of the trench 16, and a p-electrode 18 was formed on the transparent electrode 15 (FIG. 1D). The transparent electrode 15 may be formed after the trench 16 was formed.

Thereafter, heat treatment was performed by indirect resistance heating, and the n-electrode 17 and the p-electrode 18 were alloyed to further reduce the strain between the p-type contact layer 14 and the transparent electrode 15 as well as to reduce the contact resistance. This heat treatment was performed in an oxygen atmosphere, at a pressure of 25 Pa and a temperature of 550° C. for five minutes. The reason for performing heat treatment in an oxygen atmosphere is that the crystallinity of IZO is improved by oxidation, and light absorption is reduced.

The conditions for heat treatment are not limited to the above. Heat treatment may be performed as long as the pressure is in a range of not more than normal atmospheric pressure and the heating temperature is in a range of 400° C. to 650° C. As long as atmosphere is a gas atmosphere containing oxygen, a mixture gas of inert gas such as argon and neon or other inactive gas mixed with oxygen may be employed. The heating time may be one to twenty minutes. Under these conditions, a strain between the p-type contact layer 14 and the transparent electrode 15 can be further reduced in addition to the reduction by microwave. The heating temperature is more preferably 450° C. to 600° C., the atmosphere is more preferably an nitrogen atmosphere, the pressure is more preferably 100 Pa or less, and the heating time is more preferably three to ten minutes. Moreover, infrared heating may be employed instead of indirect resistance heating. Infrared heating is, for example, lamp heating.

Heat treatment for alloying the n-electrode 17 and the p-electrode 18 and the heat treatment for further reduction of a strain may be separately performed under the different conditions. When they are separately performed, either heat treatment may be performed first.

According to the method for producing a light-emitting device according to Embodiment 1 described above, a strain between the p-type contact layer 14 and the transparent electrode 15 can be reduced, and light absorption due to strain can be reduced. Moreover, the crystallinity of the transparent electrode 15 can be further improved, and conductivity or translucency can be further improved. As a result, the emission efficiency can be improved.

Next will be described various experiment results regarding the method for producing a light-emitting device according to Embodiment 1.

Figure 3:
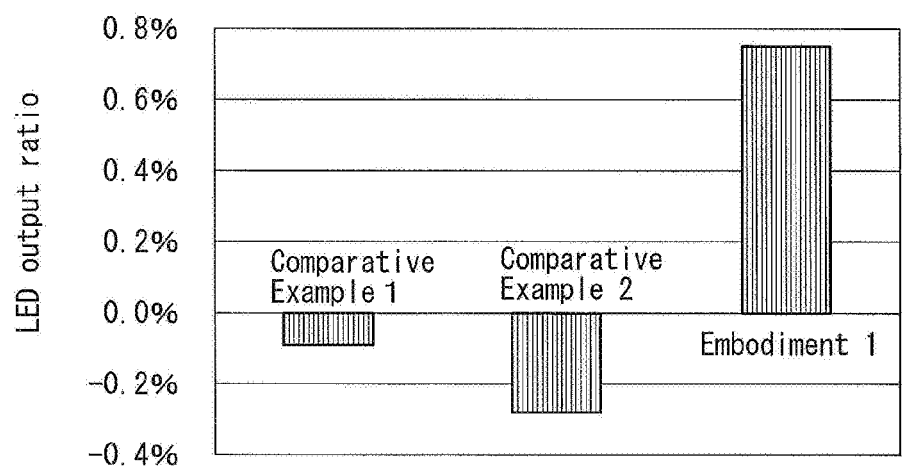
FIG. 3 is a graph showing the relationship between the timing of microwave heating and the light output.

FIG. 3 is a graph showing the relationship between the timing of microwave heating and the light output. The vertical axis indicates at what percentage the light output was improved compared to the light output of the light-emitting device manufactured in the same way except for not performing microwave heating in the processes for producing a light-emitting device according to Embodiment 1. The light output was studied in the following three cases. The first case is that microwave heating was performed after the formation of the p-type contact layer 14 and before the formation of the transparent electrode 15 (Comparative Example 1). The second case is that microwave heating was performed after the formation of the transparent electrode 15 and before the crystallization of the transparent electrode 15 by indirect resistance heating (Comparative Example 2). For Comparative Examples 1 and 2, a light-emitting device was produced in the same way as in Embodiment 1 except for the timing of microwave heating. The third case is the case of Embodiment 1 where after the formation of the transparent electrode 15, the transparent electrode 15 was crystallized by heat treatment, and then microwave heating was performed.

As shown in FIG. 3, the light output was reduced by about 0.1% in the case of Comparative Example 1 and by about 0.3% in the case of Comparative Example 2. In Comparative Examples 1 and 2, microwave heating is performed before heat treatment by indirect resistance heating. It was found in this case that the emission efficiency is hardly affected, and rather the emission efficiency is slightly reduced. This is considered that microwave heating does not affect the reduction of strain because the transparent electrode 15 is not preferentially heated. On the other hand, in the case of Embodiment 1, the light output was increased by about 0.75%. It was found from this result that the emission efficiency is improved by performing microwave heating after the transparent electrode 15 was heat treated by indirect resistance heating. This is considered that a grain boundary formed by the crystallization of the transparent electrode 15 by indirect resistance heating is preferentially heated by microwave heating so that the strain is reduced.

Figure 4:
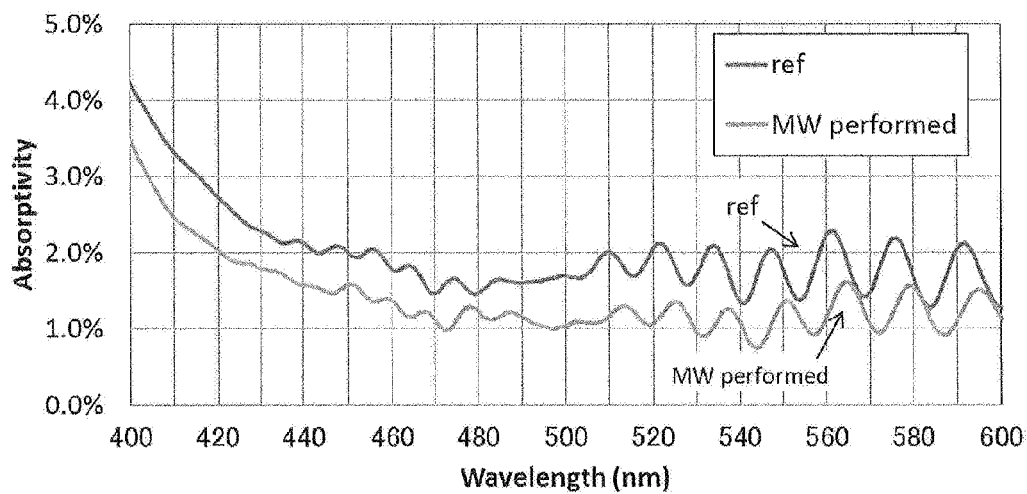
FIG. 4 is a graph showing the dependency of the absorptivity of transparent electrode on p-GaN on the wavelength.
Figure 5:
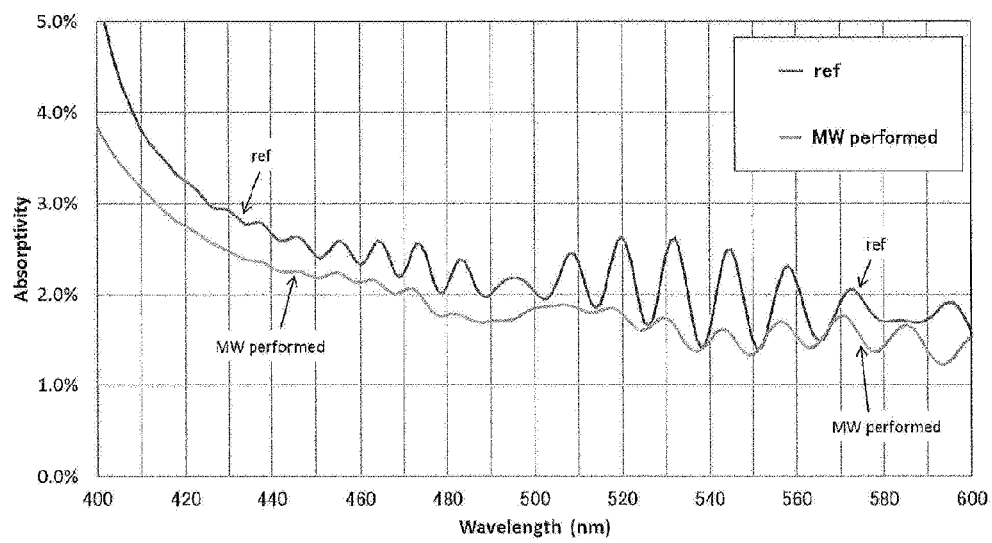
FIG. 5 is a graph showing the dependency of the absorptivity of transparent electrode on p-GaN on the wavelength.
Figure 6:
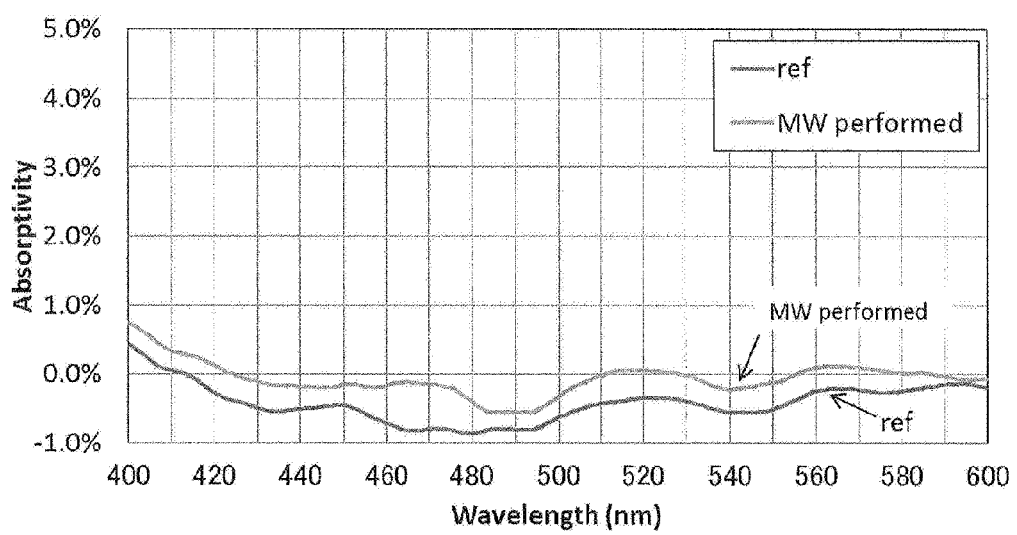
FIG. 6 is a graph showing the dependency of the absorptivity of transparent electrode on sapphire on the wavelength.

FIGS. 4 to 6 show the measurement results of absorptivity of IZO being a material of the transparent electrode 15. FIGS. 4 and 5 show the case where IZO was formed on p-GaN, and FIG. 6 shows the case where IZO was formed on a sapphire substrate. The absorptivity of IZO in FIGS. 4 and 6 were measured after performing heat treatment by indirect resistance heating in an nitrogen atmosphere after the formation of IZO, subsequently performing microwave heating, and then performing heat treatment by indirect resistance heating in an oxygen atmosphere. FIG. 5 is the case where heat treatment in an oxygen atmosphere (after microwave heating) was omitted in FIG. 4. For comparison, FIGS. 4 to 6 also show the measurement results of the absorptivity in the case where microwave heating was not performed. The conditions for indirect resistance heating or microwave heating in FIGS. 4 to 6 are the same as those in Embodiment 1.

As shown in FIGS. 4 and 5, it was found that when IZO was formed on p-GaN and microwave heating was performed, the absorptivity of IZO is reduced and the translucency is improved compared to the case where microwave heating was not performed on IZO. As shown in FIG. 6, it was found that when IZO was formed on a sapphire substrate and microwave heating was performed, the absorptivity of IZO is unchanged. The minus values of absorptivity in FIG. 6 are probably caused by the factors such as measurement environment, and may be considered to be substantially almost zero.

There is a difference in the way of strain of IZO due to different crystal structure between when IZO was formed on p-GaN and when IZO was formed on a sapphire substrate. It is assumed that the microwave heating acts in a direction for reducing the strain between p-GaN and IZO and the absorptivity is reduced, and the microwave heating does not act in a direction for reducing the strain between sapphire and IZO and the absorptivity is unchanged. It is assumed from the comparison of FIG. 4 and FIG. 5 that heat treatment in an oxygen atmosphere after the microwave heating has an effect of further reducing a strain and reducing light absorption.

Variations

In Embodiment 1, Mg was used as a p-type impurity. Zn, Be, and Ca may also be used other than Mg. Mg is preferably used because the activation rate is high. The contact layer on which the transparent electrode is formed may be doped with impurities other than p-type impurity, for example, n-type impurity such as Si or impurity to control magnetism such as Mn.

The light-emitting device according to Embodiment 1 is of a face-up type having an n-electrode and a p-electrode on the same surface. However, alternatively, the method for producing a semiconductor device of the present invention may also be applied to a flip-chip-type light-emitting device or a light-emitting device having a vertical conductive structure obtained by removing a growth substrate by a laser lift-off technique or using a conductive substrate as a growth substrate. Moreover, the present invention may also be applied to the production of various semiconductor devices other than the light-emitting device such as pn diode, photo diode, FET, and HFET. A semiconductor device may have any structure as long as a transparent electrode is formed on the Group III nitride semiconductor layer. A semiconductor layer in contact with the transparent electrode is not limited to p-type and may be any conductive type such as n-type or undoped.

The present invention can be employed to produce a Group III nitride light-emitting device, and the light-emitting device can be employed as a light source of a display apparatus or an illumination apparatus.

What is claimed is:

1. A method for producing a semiconductor device having a transparent electrode on and in contact with a Group III nitride semiconductor layer, the method comprising:
    forming the transparent electrode consisting of Zinc-doped Indium Oxide (IZO) on the Group III nitride semiconductor layer;
    performing heat treatment at a first temperature by at least one of indirect resistance heating and infrared heating under an atmosphere containing nitrogen in a normal atmospheric pressure or a reduced pressure after the formation of the transparent electrode to crystallize the transparent electrode;
    reducing a strain between the semiconductor layer and the transparent electrode by microwave heating under an atmosphere containing nitrogen at a second temperature after the heat treatment; and
    performing another heat treatment at a third temperature by at least one of indirect resistance heating and infrared heating under an atmosphere containing oxygen to further crystallize the transparent electrode after the microwave heating,
    wherein the microwave heating is performed at a second temperature in a range of 100° C. to 350° C. and lower than the first temperature.

2. The method for producing a semiconductor device according to claim 1, wherein the first temperature is in a range of 600° C. to 800° C.

3. The method for producing a semiconductor device according to claim 1, wherein the third temperature is in a range of 400° C. to 650° C.

4. The method for producing a semiconductor device according to claim 2, wherein the third temperature is in a range of 400° C. to 650° C.

* * * * *